US005773368A

United States Patent [19]

Moran

[11] Patent Number: 5,773,368

[45] Date of Patent: Jun. 30, 1998

[54] METHOD OF ETCHING ADJACENT LAYERS

[75] Inventor: John D. Moran, Mesa, Ariz.

[73] Assignee: Motorola, Inc., Schaumburg, Ill.

[21] Appl. No.: 599,457

[22] Filed: Jan. 22, 1996

[51] Int. Cl.[6] .................................................... H01L 21/70

[52] U.S. Cl. ............................................ 438/742; 438/739

[58] Field of Search ........................... 437/47; 156/625.1; 438/735, 736, 739, 742

[56] References Cited

U.S. PATENT DOCUMENTS

| | | | |
|---|---|---|---|
| 3,571,913 | 3/1971 | Bodway | 29/571 |
| 5,130,267 | 7/1992 | Kaya et al. | 437/47 |

*Primary Examiner*—John Goodrow
*Attorney, Agent, or Firm*—George C. Chen

[57] ABSTRACT

A method of manufacturing a semiconductor component includes sputtering a first metal layer (16) over a substrate (11), sputtering a second metal layer (17) over the first metal layer (16), selectively etching the second metal layer (17) versus the first metal layer (16), selectively etching the first metal layer (16) versus the second metal layer (17), and thereafter, selectively re-etching the second metal layer (17) versus the first metal layer (16).

27 Claims, 2 Drawing Sheets

METHOD OF ETCHING ADJACENT LAYERS

BACKGROUND OF THE INVENTION

This invention relates, in general, to semiconductor components, and more particularly, to methods of etching adjacent layers in a semiconductor component.

Semiconductor components often have two or more adjacent layers that form a single structure. For instance, many metal schemes known to those of average skill in the art use different layers of metals to form a single metal structure. As an example, a Schottky contact for a vertical semiconductor diode typically includes a stack of metals such as a solder flux metal on a diffusion barrier metal on a Schottky metal, which resides on a semiconductor substrate.

A conventional patterning technique for the Schottky contact generally involves first etching the solder flux metal to expose a portion of the diffusion barrier metal, etching the exposed diffusion barrier metal to expose a portion of the Schottky metal, and then etching the exposed Schottky metal. However, the etchants used in the patterning technique typically undercut the solder flux metal, the diffusion barrier metal, and the Schottky metal, which produces an "inverse staircase" profile for the Schottky contact. As a result of its "inverse staircase" profile, the Schottky contact often peels off of the semiconductor substrate during sawing and dicing operations, which significantly reduces manufacturing yields.

Accordingly, a need exists for a method of patterning adjacent layers that does not produce an "inverse staircase" profile in a semiconductor component.

The method should be cost-effective, manufacturable, and compatible with existing semiconductor fabrication processes.

DETAILED DESCRIPTION OF THE DRAWINGS

Figure 1:
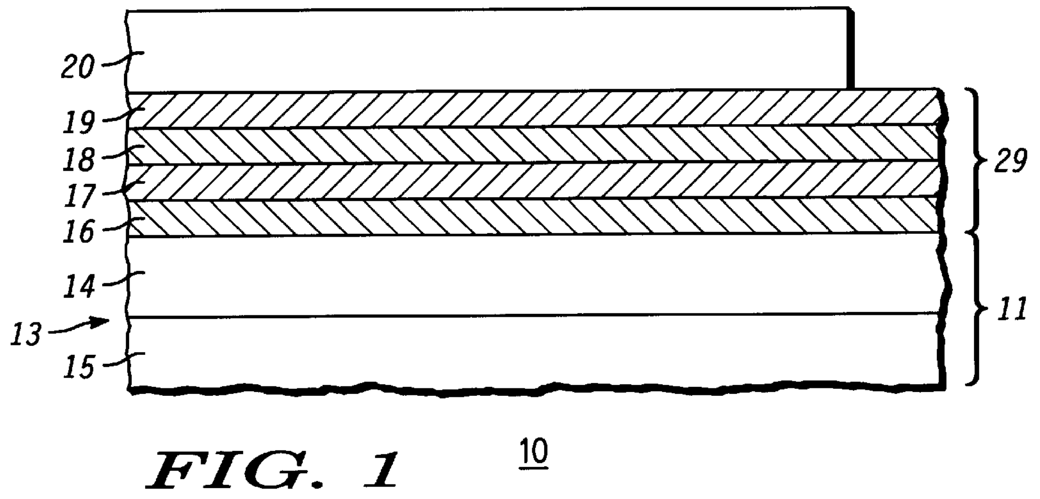
FIG. 1 illustrates a partial cross-sectional view of an embodiment of a semiconductor component during fabrication in accordance with the present invention.

Turning to the figures for a more detailed description, FIG. 1 illustrates a partial cross-sectional view of an embodiment of a semiconductor component 10 during fabrication. Semiconductor component 10 includes a substrate 11 coupled to a Schottky contact 29. In the preferred embodiment, semiconductor component 10 is a vertical semiconductor diode. It is understood that FIG. 1 illustrates a simplified partial schematic view of a vertical semiconductor diode, which can also include electrically insulating layers (not shown), guard rings (not shown), or the like. It is further understood that substrate 11 can include a plurality of vertical semiconductor diodes. In an alternative embodiment, semiconductor component 10 also includes other semiconductor devices such as, for example, field effect transistors.

Substrate 11 is comprised of a semiconducting material including, but not limited to, silicon or gallium arsenide. Substrate 11 includes a region 14 overlying and contacting a region 15 at a junction 13. In the preferred embodiment, region 14 is a lightly doped n-type region, and region 15 is a heavily doped n-type region. Accordingly, junction 13 is an $n^{-}$-$n^{+}$junction. Alternatively, regions 14 and 15 are p-type regions with different doping concentrations, or region 14 can be n-type while region 15 is p-type. Regions 14 and 15 and junction 13 are fabricated by epitaxial growth techniques, diffusion processes, or other methods known to those skilled in the art.

Schottky contact 29 includes metal layers 16, 17, 18, and 19. Preferably, metal layer 16 is disposed over substrate 11 to a thickness of approximately 1,000–2,000 angstroms (Å) by using a sputtering process. Next, metal layer 17 is preferably sputtered to a thickness of approximately 2,500–3,500 Å over metal layer 16, and metal layer 18 is preferably sputtered to a thickness of approximately 1,500–2,500 Å over metal layer 17. Then, metal layer 19 is sputtered to a thickness of approximately 1,000–2,000 Å over metal layer 18. It is understood that metal layers 16, 17, 18, and 19 can alternatively be deposited by plating or other techniques known in the art.

After the deposition of metal layers 16, 17, 18, and 19, an etch mask 20 is provided or formed over metal layer 19. Etch mask 20 is comprised of a patterned photoresist layer, a patterned oxide layer, or the like.

In the preferred embodiment, metal layer 16 is comprised of a Schottky barrier material including, but not limited to, chrome, tungsten, or titanium. Accordingly, metal layer 16 forms a Schottky junction with region 14 of substrate 11.

Metal layer 17 preferably comprises an isolation or diffusion barrier material such as, for example, titanium tungsten. Metal layer 17 prevents the constituents of overlying metal layers 18 and 19 from diffusing through metal layer 17 and into underlying metal layer 16 and underlying substrate 11.

Metal layer 18 preferably comprises a solderable material such as, for example, nickel vanadium or nickel. Metal layer 18 serves as a surface that adheres to solder. In the preferred embodiment, the subsequently attached solder is comprised of lead, indium, and silver.

In the preferred embodiment, metal layer 19 is comprised of a solder flux material including, but not limited to, gold or silver. Metal layer 19 serves as a flux for the subsequent soldering process and also serves to inhibit oxidation of underlying metal layer 18.

Figure 2:
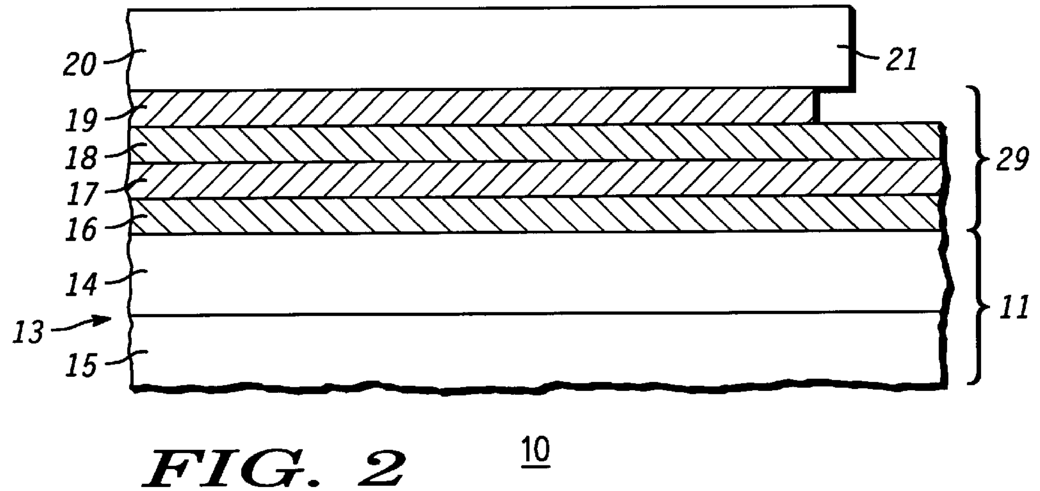
FIGS. 2, 3, 4, 5, and 6 portray partial cross-sectional views of the semiconductor component of FIG. 1 after subsequent processing operations in accordance with the present invention.

Continuing with the next figure, FIG. 2 portrays a partial cross-sectional view of semiconductor component 10 in FIG. 1 after etching metal layer 19. Elements of FIG. 2 that have the same reference numerals as FIG. 1 are the same as the corresponding FIG. 1 elements. In the preferred embodiment where metal layer 19 comprises gold, a potassium cyanide based etchant is used to isotropically and selectively wet etch metal layer 19. However, regardless of the specific etchant used to etch metal layer 19, underlying metal layer 18 and overlying etch mask 20 should not be significantly etched relative to metal layer 19. In other words, the etchant used to etch metal layer 19 should selectively etch metal layer 19 versus metal layer 18 and etch mask 20. Therefore, underlying metal layer 18 serves as an etch stop during the etch process for metal layer 19.

Metal layer 19 is undercut relative to etch mask 20 due to the isotropic nature of the etchant used to pattern metal layer 19. Consequently, metal layer 19 is removed from underneath portion 21 of etch mask 20 as portrayed in FIG. 2.

Figure 3:
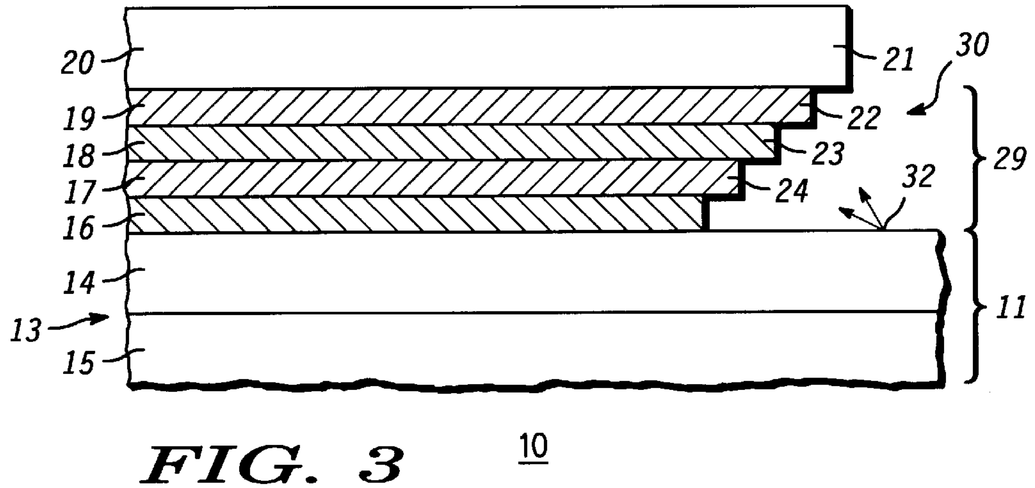

Next, referring to FIG. 3, metal layers 18, 17, and 16 are sequentially etched and undercut in a manner similar to that described previously for metal layer 19. First, metal layer 18 is etched and undercut relative to portion 22 of metal layer 19. Then, metal layers 17 and 16 are etched and undercut relative to portion 23 of metal layer 18 and portion 24 of metal layer 17, respectively. Preferably, the amount of undercut for metal layers 18, 17, and 16 is in the same order of magnitude as that of metal layer 19.

Preferably, a different etchant is used to sequentially etch each of metal layers 18, 17, and 16. In the preferred embodiment where metal layers 18, 17, and 16 are comprised of nickel vanadium, titanium tungsten, and chromium, respectively, the etchants used to sequentially etch metal layers 18, 17, and 16 are comprised of nitric acid, hydrogen peroxide, and ceric ammonium nitrate, respectively. It is understood by those skilled in the art that other suitable etchants can be substituted for the isotropic wet etchants listed for the preferred embodiment. However, as discussed earlier, regardless of the specific etchants used, the etchants should selectively etch the desired metal layer and should not significantly etch etch mask 20 or other adjacent and exposed metal layers. For example, when etching metal layer 17, etch mask 20 and overlying metal layers 18 and 19 serve as etch masks, and underlying metal layer 16 serves as an etch stop.

After sequentially etching metal layers 19, 18, 17, and 16, Schottky contact 29 has an edge 30. As depicted in FIG. 3, edge 30 forms an "inverse staircase" profile or a positive sloping profile resulting from the undercutting etch processes described previously. However, because of its positive sloping profile, edge 30 of Schottky contact 29 peels off of substrate 11 during subsequent mechanical sawing and Schottky contact cleaning processes. As known in the art, highly pressurized water is sprayed onto substrate 11 to remove debris from substrate 11 during sawing of substrate 11, and highly pressurized water is also used to scrub or clean the top surface of Schottky contact 29 prior to wiring bonding.

During these subsequent processes, water is sprayed onto substrate 11 at high pressures of approximately 50–150 kilograms per centimeter squared (kg/cm$^2$), and the sprayed water reflects off of substrate 11 and toward edge 30 as indicated by arrows 32 in FIG. 3. The hydraulic force of the sprayed water mechanically stresses edge 30 and lifts edge 30 and portions of Schottky contact 29 off of substrate 11, which produces a defective semiconductor component 10.

Furthermore, the profile of edge 30 enhances shear forces associated with the varying thermal expansion coefficients of metal layers 16, 17, 18, and 19. For example, the shear forces tend to deform or curl the edge of metal layer 19 away from substrate 11, and this deformation causes reliability issues.

Dry etching techniques can reduce the amounts of undercut in metal layers 16, 17, 18, and 19, which reduces the positive slope of edge 30. However, some dry etchants that are considered anisotropic still exhibit a small degree of isotropic behavior. Furthermore, dry etching is much more expensive than wet etching, and depending upon the specific composition of metal layers 16, 17, 18, and 19, dry etchants having all of the desired etch selectivities described previously may not be commercially available. Therefore, a wet etching technique is preferably used to pattern Schottky contact 29.

Figure 4:
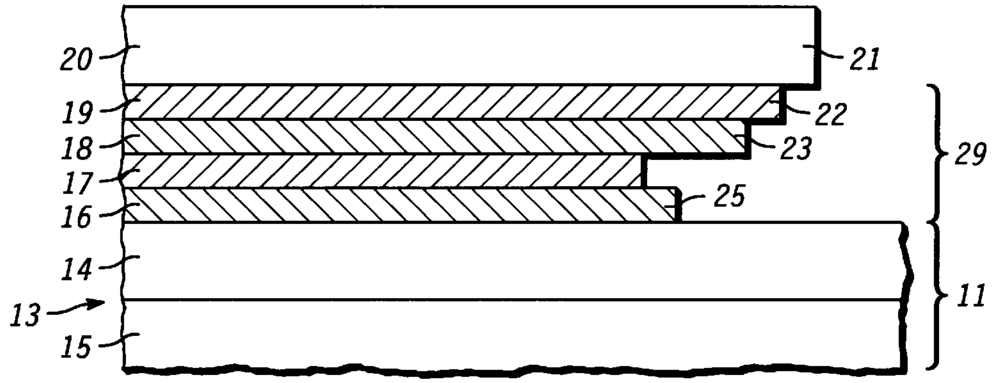

To eliminate the positive sloping profile of edge 30, metal layer 17 is etched or patterned a second time after etching metal layer 16 and before the subsequent mechanical sawing and Schottky contact cleaning processes. The etchant previously used to pattern or etch metal layer 17 is preferably used to re-pattern or re-etch metal layer 17 the second time. As depicted in FIG. 4, the second etching of metal layer 17 undercuts metal layer 17 even further as compared to metal layer 17 in FIG. 3. After the re-etching or overetching of metal layer 17, end portion 25 of underlying metal layer 16 extends beyond metal layer 17 as portrayed in FIG. 4.

Figure 5:
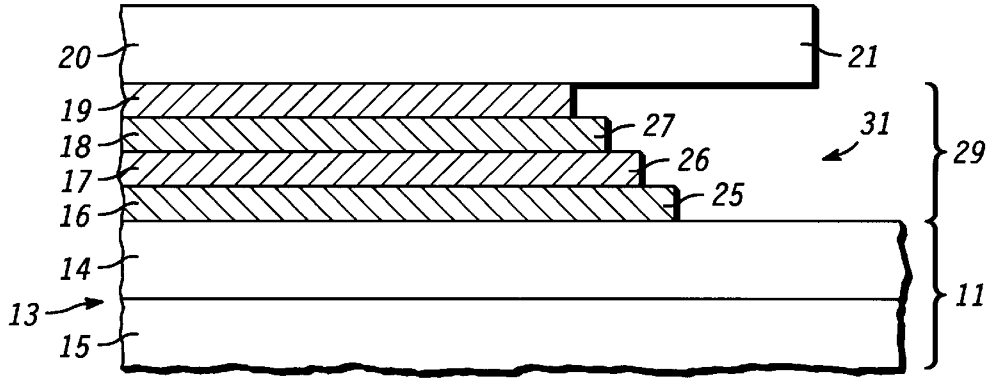

Next, metal layer 18 is re-etched, and then metal layer 19 is also re-etched, which produces the cross-sectional embodiment of semiconductor component 10 portrayed in FIG. 5. In the preferred embodiment, a similar etchant is used to pattern metal layer 18 during both the initial etching process and the re-etching process. Likewise, a similar etchant is preferably used during the first and second etching of metal layer 19.

Due to the re-etching steps, metal layers 18 and 19 in FIG. 5 are undercut even further relative to metal layers 18 and 19 in FIGS. 3 and 4. Consequently, end portion 26 of underlying metal layer 17 extends beyond metal layer 18, and end portion 27 of metal layer 18 extends beyond overlying metal layer 19. Also, portion 21 of etch mask 20 extends beyond metal layers 16, 17, 18, and 19. Upon the completion of re-etching metal layers 17, 18, and 19, Schottky contact 29 has a new beveled edge 31, which has a negative sloping profile illustrated in FIG. 5 as compared to the positive sloping profile of edge 30 portrayed in FIG. 3.

Etch mask 20 remains over Schottky contact 29 at least until the completion of re-etching metal layers 17, 18, and 19. The formation of edge 31 preferably uses a single etch mask instead of a plurality of etch masks in order to reduce the cycle time of fabricating semiconductor component 10.

Figure 6:
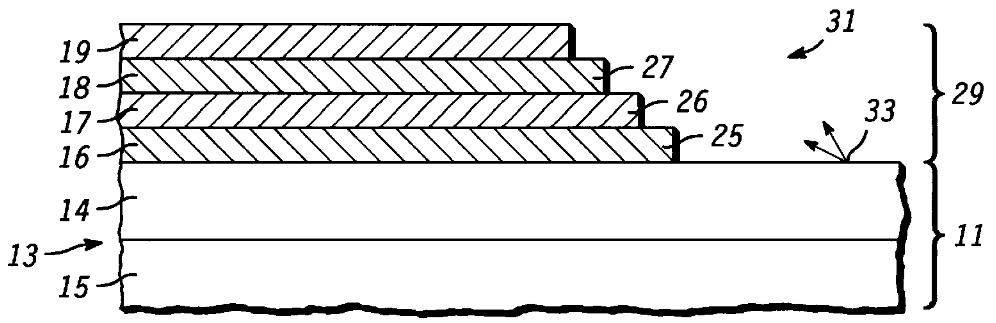

Then, etch mask 20 is removed from Schottky contact 29, and semiconductor component 10 is subsequently subjected to Schottky metal cleaning and mechanical sawing procedures, which spray high pressure water toward substrate 11 as indicated by arrows 33 in FIG. 6. Due to the negative sloping profile of edge 31, Schottky contact 29 is unlikely to be lifted off of substrate 11 during the die singulation and metal cleaning processes, which solves the problem in the prior art of peeling metal during the spraying of highly pressurized water.

Edge 31 also aids in controlling the shear forces associated with the thermal expansion of metal layers 16, 17, 18, and 19. Because each metal layer within Schottky contact 29 is supported underneath by an adjacent layer, the metal layers of Schottky contact 29 will not deform or curl away from substrate 11. Metal layers 16, 17, 18, and 19 will also not deform or curl away from substrate 11 because of a layer of solder (not shown) that is subsequently formed overlying Schottky contact 29.

While the invention has been particularly shown and described with reference to preferred embodiments, it will be understood by those skilled in the art that changes in form and detail may be made without departing from the spirit and scope of the invention. For instance, substrate 11 can be comprised of a non-semiconducting material such as, for example, a circuit board. As an additional example, metal layers 16, 17, 18, and 19 can represent electrically insulating layers including thermal oxides, silicon nitrides, polyimides, or the like. Furthermore, while the present invention has been exemplified in FIGS. 1–6 by a process that etches four layers, it is understood that the present invention can also be applied to structures having less than or greater than four layers.

Therefore, in accordance with the present invention, it is apparent there has been provided an improved method of etching adjacent layers that overcomes the disadvantages of the prior art. The present invention reduces susceptibility to the peeling of Schottky contacts in vertical semiconductor diodes. Additionally, the present invention is also manufacturable, cost-effective, and compatible with existing semiconductor fabrication processes.

I claim:

1. A method of patterning adjacent layers, the method comprising the steps of:

providing a substrate;

disposing a first layer overlying the substrate;

disposing a second layer overlying and adjacent to the first layer;

patterning the second layer;

patterning the first layer after pattering the second layer; and subsequently, patterning the second layer.

2. The method according to claim 1, wherein the step of disposing the first layer includes disposing a Schottky barrier material and wherein the step of disposing the second layer includes disposing a solderable material.

3. The method according to claim 1, wherein the step of patterning the first layer includes selectively etching the first layer relative to the second layer.

4. The method according to claim 1, wherein the step of patterning the first layer includes undercutting the first layer relative to the second layer.

5. The method according to claim 1, wherein the step of patterning the first layer includes wet etching the first layer, and wherein the two steps of patterning the second layer include wet etching the second layer.

6. The method according to claim 1, wherein the two steps of patterning the second layer include isotropically etching the second layer with an etchant.

7. The method according to claim 1, wherein the two steps of patterning the second layer include selectively etching the second layer relative to the first layer.

8. The method according to claim 1, further comprising the step of forming an etch mask over the second layer before the two steps of patterning the second layer and before the step of patterning the first layer, wherein the two steps of patterning the second layer include using the etch mask and wherein the step of patterning the first layer includes using the etch mask.

9. A method of manufacturing a semiconductor component, the method comprising the steps of:

providing a substrate;

providing a first layer overlying the substrate, the first layer comprised of a first metal layer;

providing a second layer overlying the first layer, the second layer comprised of a second metal layer;

providing an etch mask overlying the second layer; and isotropically etching the first and second layers after providing the first layer, the second layer, and the etch mask, the etch mask overlying the second layer at least until completion of the isotropically etching step, wherein after isotropically etching the first and second layers, a portion of the first layer extends beyond the second layer and a portion of the etch mask extends beyond the first and second layers.

10. The method according to claim 9, wherein the step of providing the first layer includes depositing a first metal layer and wherein the step of providing the second layer includes depositing a second metal layer.

11. The method according to claim 9, wherein the step of isotropically etching the first and second layers includes sequentially etching the second layer with a first etchant, etching the first layer with a second etchant, and re-etching the second layer.

12. The method according to claim 11, wherein the step of re-etching the second layer includes using the first etchant.

13. The method according to claim 9, further comprising the steps of:

providing a third layer overlying the second layer before the step of isotropically etching the first and second layers;

etching the third layer with a third etchant before the step of isotropically etching the first and second layers; and patterning the third layer after the step of isotropically etching the first and second layers.

14. The method according to claim 13, wherein the step of patterning the third layer includes using the third etchant to etch the third layer.

15. A method of manufacturing a semiconductor component, the method comprising the steps of:

providing a substrate;

sputtering a first metal layer overlying the substrate;

sputtering a second metal layer overlying the first metal layer;

forming an etch mask overlying the second metal layer;

selectively wet etching the second metal layer versus the first metal layer and the etch mask;

selectively wet etching the first metal layer versus the second metal layer and the etch mask after selectively wet etching the second metal layer;

selectively re-etching the second metal layer versus the first metal layer and the etch mask after the step of selectively wet etching the second metal layer and after the step of selectively wet etching the first metal layer; and removing the etch mask.

16. The method according to claim 15, wherein the step of selectively wet etching the first metal layer includes undercutting the first metal layer relative to the second metal layer and using the second metal layer as another etch mask.

17. The method according to claim 15, wherein the step of selectively re-etching the second metal layer includes overetching the second metal layer relative to the first metal layer.

18. The method according to claim 15, further comprising the steps of:

sputtering a third metal layer over the second metal layer before the step of forming the etch mask;

selectively wet etching the third metal layer versus the second metal layer and the etch mask before the step of selectively wet etching the second metal layer; and thereafter, selectively re-etching the third metal layer versus the second metal layer, the first metal layer, and the etch mask after the step of selectively re-etching the second metal layer and before the step of removing the etch mask.

19. The method according to claim 18, wherein the step of sputtering the first metal layer includes providing a Schottky barrier material for the first metal layer, wherein the step of sputtering the second metal layer includes providing a diffusion barrier material for the second metal layer, and wherein the step of sputtering the third metal layer includes providing a solderable material.

20. The method according to claim 18, wherein the step of sputtering the first metal layer includes sputtering chromium, wherein the step of sputtering the second metal layer includes sputtering titanium tungsten, and wherein the step of sputtering the third metal layer includes sputtering nickel vanadium.

21. The method according to claim 1:

wherein patterning the first layer includes undercutting the first layer relative to the second layer wherein a portion of the second layer extends beyond the first layer after the undercutting step, wherein patterning the second layer the second time includes removing the portion of the second layer that extends beyond the first layer, and wherein after patterning the second layer the second time, a portion of the first layer extends beyond the second layer.

22. The method according to claim 1:

wherein disposing the first layer includes disposing a first metal layer and wherein disposing the second layer includes disposing a second metal layer.

23. The method according to claim 1:

wherein patterning the first layer occurs only after patterning the second layer the first time and occurs between patterning the second layer the first time and patterning any other layers, and wherein patterning the second layer the second time occurs after patterning the first layer and occurs between patterning the first layer and before patterning any other layers.

24. The method according to claim 13 wherein providing the third layer includes providing the third metal layer underlying the etch mask, wherein isotropically etching the first and second layers occurs only after etching the third layer, wherein the etch mask overlies the third layer at least until completion of the patterning step, and wherein after patterning the third layer, the second layer extends beyond the third layer.

25. The method according to claim 15 wherein selectively wet etching the second metal layer includes undercutting the second metal layer relative to the etch mask, wherein selectively wet etching the first metal layer includes undercutting the first metal layer relative to the etch mask and the second metal layer such that a portion of the second metal layer extends beyond the first metal layer, wherein selectively re-etching the second metal layer includes removing the portion of the second metal layer extending beyond the first metal layer, and wherein after selectively re-etching the second metal layer and before removing the etch mask, a portion of the first metal layer extends beyond the second metal layer.

26. The method according to claim 18:

wherein selectively wet etching the first metal layer occurs only after selectively wet etching the second metal layer and occurs between selectively wet etching the second metal layer and etching any other layers, and wherein selectively re-etching the second metal layer occurs after selectively etching the first metal layer and occurs between selectively etching the first metal layer and etching any other layers.

27. The method according to claim 18 wherein selectively wet etching the third metal layer includes undercutting the third metal layer relative to the etch mask, wherein selectively wet etching the second metal layer occurs only after selectively wet etching the third metal layer and includes undercutting the second metal layer relative to the third metal layer such that a portion of the third metal layer extends beyond the second metal layer, wherein selectively wet etching the first metal layer occurs only after selectively wet etching the second metal layer and includes undercutting the first metal layer relative to the second metal layer such that a portion of the second metal layer extends beyond the first metal layer, wherein selectively re-etching the second metal layer occurs only after selectively wet etching the first metal layer and includes removing the portion of the second metal layer extending beyond the first metal layer wherein after selectively re-etching the second metal layer and before selectively re-etching the third metal layer, the first metal layer extends beyond the second metal layer, and wherein selectively re-etching the third metal layer occurs only after selectively re-etching the second metal layer and includes removing the portion of the third metal layer extending beyond the second metal layer wherein after selectively re-etching the third metal layer and before removing the etch mask, the second metal layer extends beyond the third metal layer.

* * * * *